United States Patent [19]

Grantiz et al.

[11] 4,125,309
[45] Nov. 14, 1978

[54] MINIATURE PIN BOARD ASSEMBLY

[75] Inventors: Richard F. Grantiz; William H. Rose, both of Harrisburg, Pa.

[73] Assignee: AMP Incorporated, Harrisburg, Pa.

[21] Appl. No.: 808,846

[22] Filed: Jun. 22, 1977

[51] Int. Cl.² .......................................... H01R 29/00
[52] U.S. Cl. .................................................. 339/18 P
[58] Field of Search ........................................... 339/18

[56] References Cited

U.S. PATENT DOCUMENTS

| 296,253 | 4/1884 | Vail .................................... 339/18 C |
| 3,137,534 | 6/1964 | Schafer et al. ...................... 339/18 C |
| 3,258,730 | 6/1966 | Husband et al. .................... 339/18 C |

Primary Examiner—Roy Lake
Assistant Examiner—E. F. Desmond
Attorney, Agent, or Firm—Gerald K. Kita

[57] ABSTRACT

A miniature matrix is provided by coplanar conductive strips in a first row overlaid by a second row of coplanar strips. Both rows of strips are embedded within a molded substrate of elastomeric material which is sufficiently rigid to maintain the rows in spaced relationship. A plurality of recesses are provided in the substrate and are arranged in columns and rows. Each recess exposes a conductor in the first row and a conductor in the second row where such conductors cross each other. A conductive pin is inserted into a selected aperture to engage the corresponding exposed conductors, thereby making a cross point connection. The elastomeric material encircling the selected recess is elastically expanded upon insertion of the pin and exerts a resilient and residual retention force on the pin biasing the same into positive electrical contact with the cross point connected conductors.

4 Claims, 7 Drawing Figures

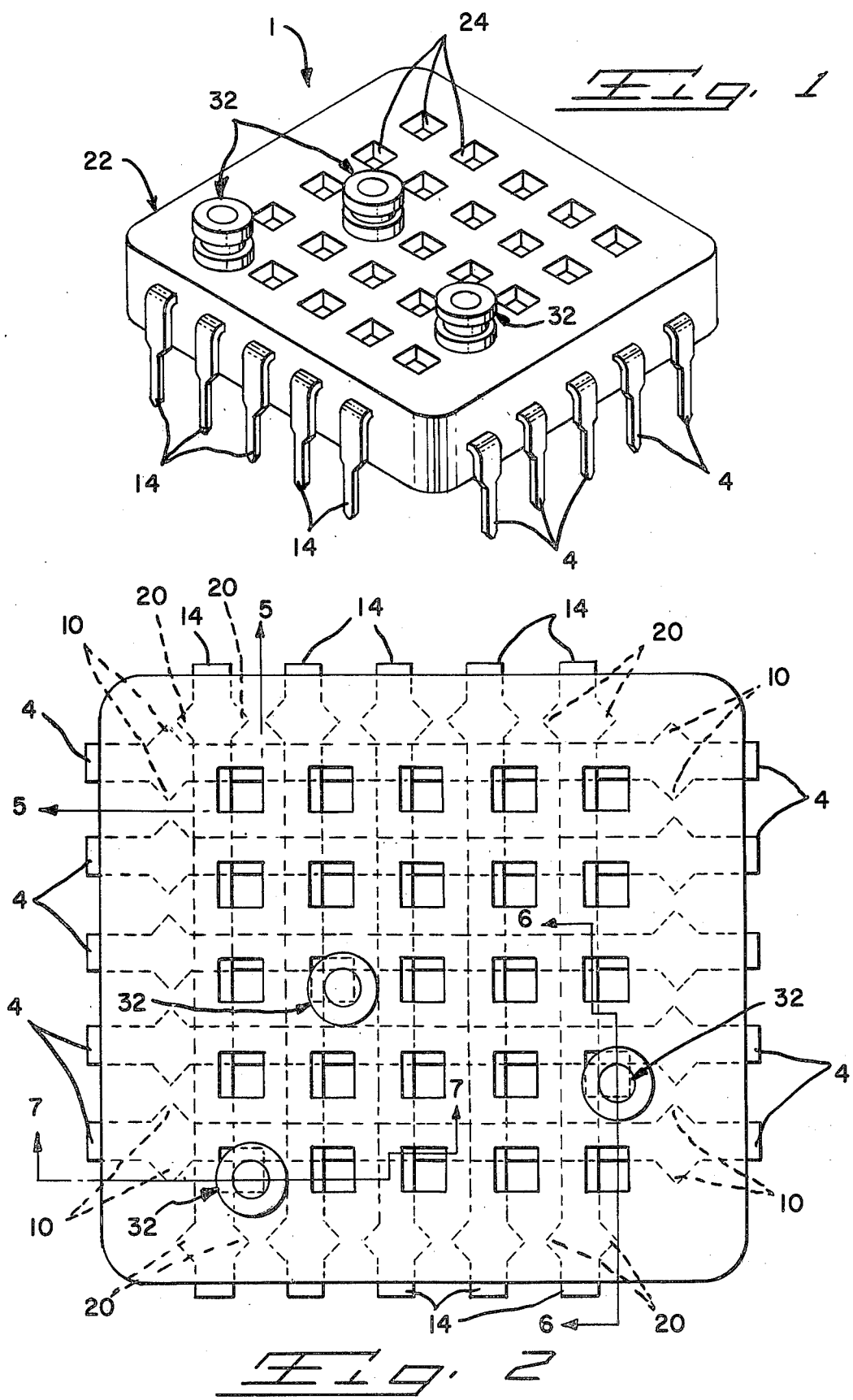

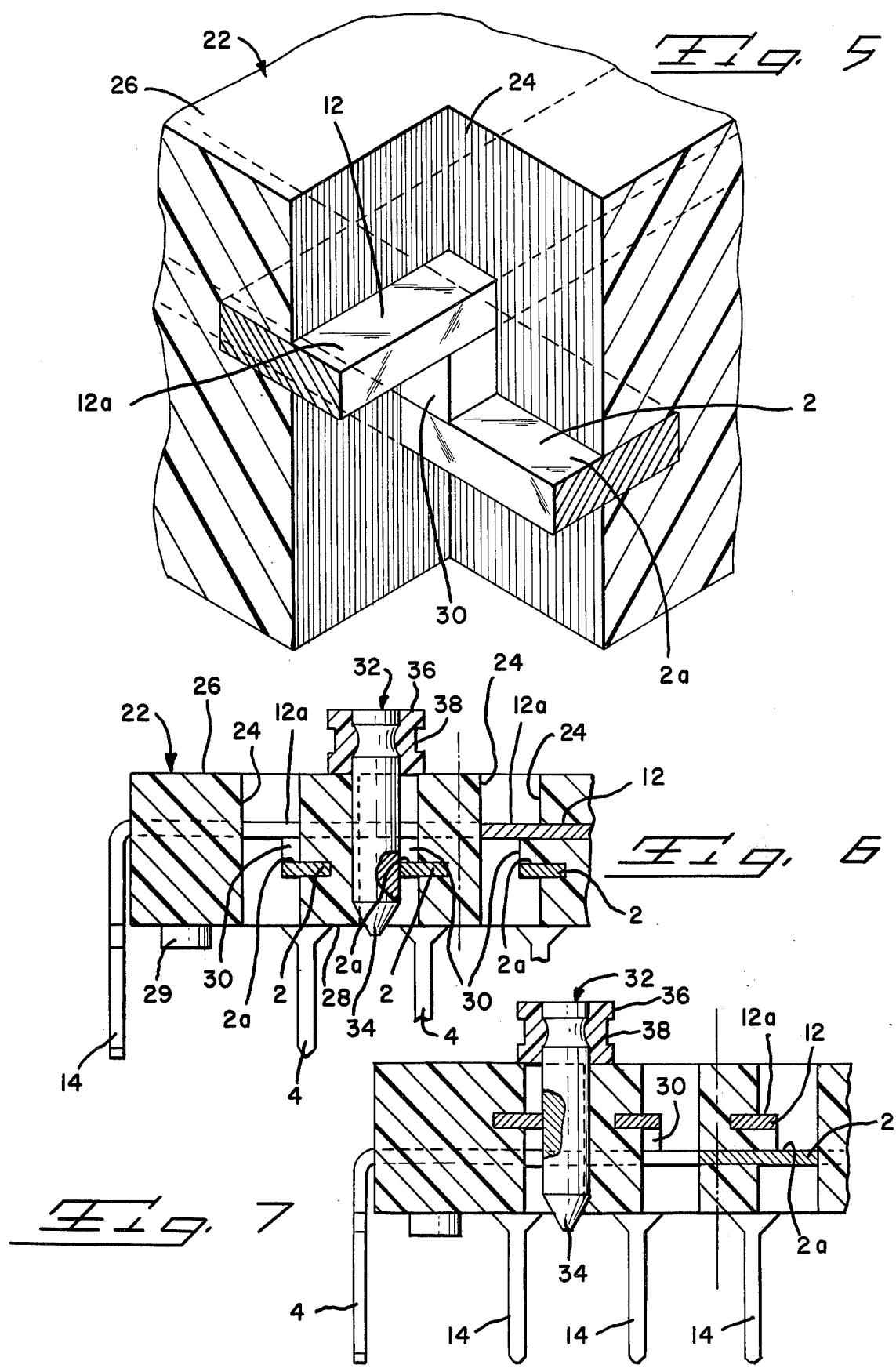

MINIATURE PIN BOARD ASSEMBLY

BACKGROUND OF THE INVENTION

The present invention relates to the art of pin boards wherein pin conductors are selectively inserted into matrix of apertures of a pin board assembly which generally comprises a substrate having a plurality of conductors which are selectively connected together by the inserted pins. One example of a pin board assembly is disclosed in Patent No. 3,175,179 which includes input output contacts in the form of resilient fingers which grip inserted pins. Such an assembly is difficult to make in miniature size because of the height and width of the spring fingers. U.S. Pat. No. 3,217,283 discloses a pin board assembly which can be made of miniature size. In one embodiment, input and output conductors are provided on opposite sides of a double sided printed circuit board which further is provided with angled pin holes. A conductive wire is deformed upon insertion into an angled pin hole and a cross connection is maintained by the inherent resiliency of the wire. In another embodiment the pin holes are straight, but the pins are curved. In each of the embodiments, insertion of a corresponding pin tends to flex the pin and cause it to store energy which in turn locks the pin in a corresponding pin hole.

BRIEF DESCRIPTION

A pin board assembly according to the present invention is distinguished from that shown in U.S. Pat. No. 3,175,179 because the conductors to be cross connected are of a planar configuration and they are capable of miniaturization. The present invention can be distinguished from the pin board assembly of U.S. Pat. No. 3,217,283 because pin retention and also sufficient electrical contact pressure is provided by resilient yielding of an elastomeric material rather than by deflection of the conductors to be cross connected or by deflection of the cross connecting pins.

OBJECTS

It is an object of the present invention to provide a pin board assembly of miniature size using an elastomeric material which positions conductors to be cross connected and which defines pin board openings and which yields elastically to bias a cross connecting pin into engagement with corresponding conductors with sufficient electrical contact pressure and to resiliently grip the pin for retention of the same.

Another object of the present invention is to provide a pin board assembly with rows of planar contacts embedded in a substrate of elastomeric material which maintains the conductors in desired positions for cross connection of the same by conductive pins selectively inserted into corresponding openings of the substrate, the substrate yielding elastically to bias each corresponding inserted pin into positive pressure contact against edges of conductors exposed in the substrate openings, the substrate further resiliently gripping the pins to retain the same.

Other objects of the present invention will become apparent to one having ordinary skill in the art from the following detailed description taken in conjunction with the accompanying drawings.

BRIEF DESCRIPTION OF THE DRAWINGS

FIG. 1 is an enlarged perspective of a preferred embodiment of a pin board assembly according to the present invention provided with selected cross connecting pins.

FIG. 2 is an enlarged plan view of the preferred embodiment shown in FIG. 1.

FIG. 5 is an enlarged fragmentary section taken along the line 5—5 of FIG. 2.

FIG. 6 is an enlarged fragmentary section taken along the line 6—6 of FIG. 2.

FIG. 7 is an enlarged fragmentary section taken along the line 7—7 of FIG. 2.

DETAILED DESCRIPTION

Figure 3:
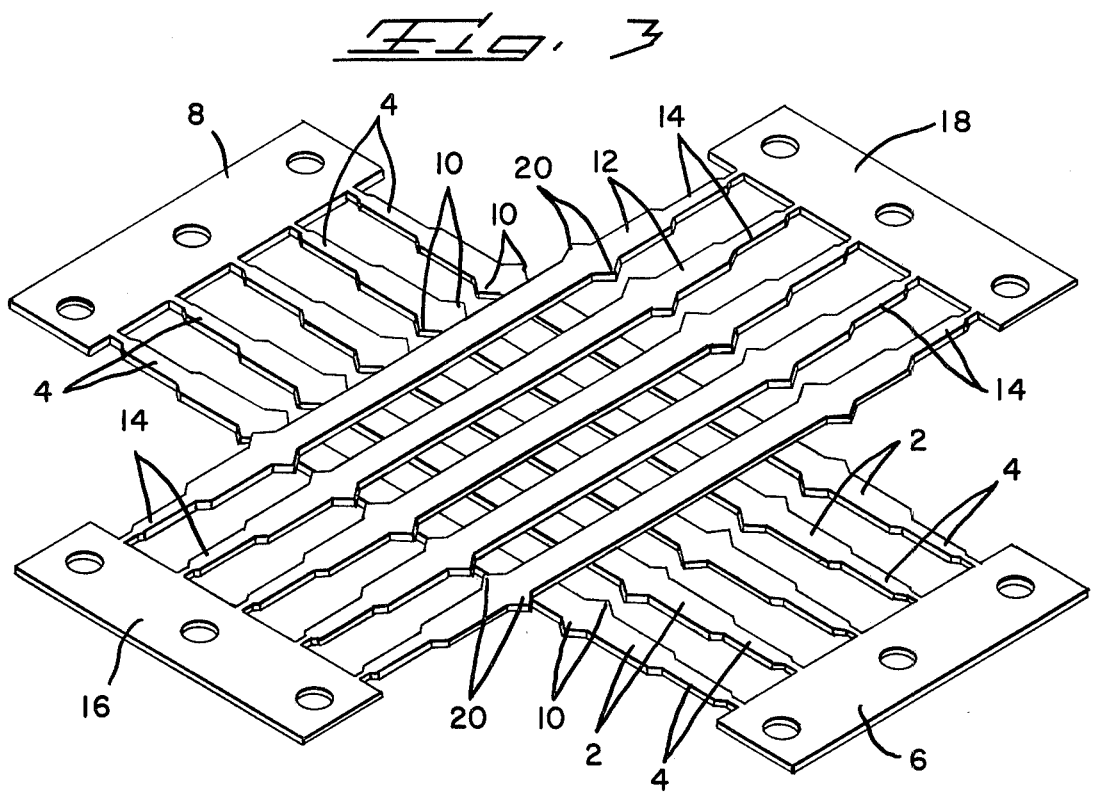
FIG. 3 is an enlarged perspective illustrating elongate rows of planar conductors attached to corresponding carrier strips, the conductors of one row being coplanar and overlying coplanar conductors of another row, the rows being shown in positions prior to being embedded in an elastomeric substrate.
Figure 4:
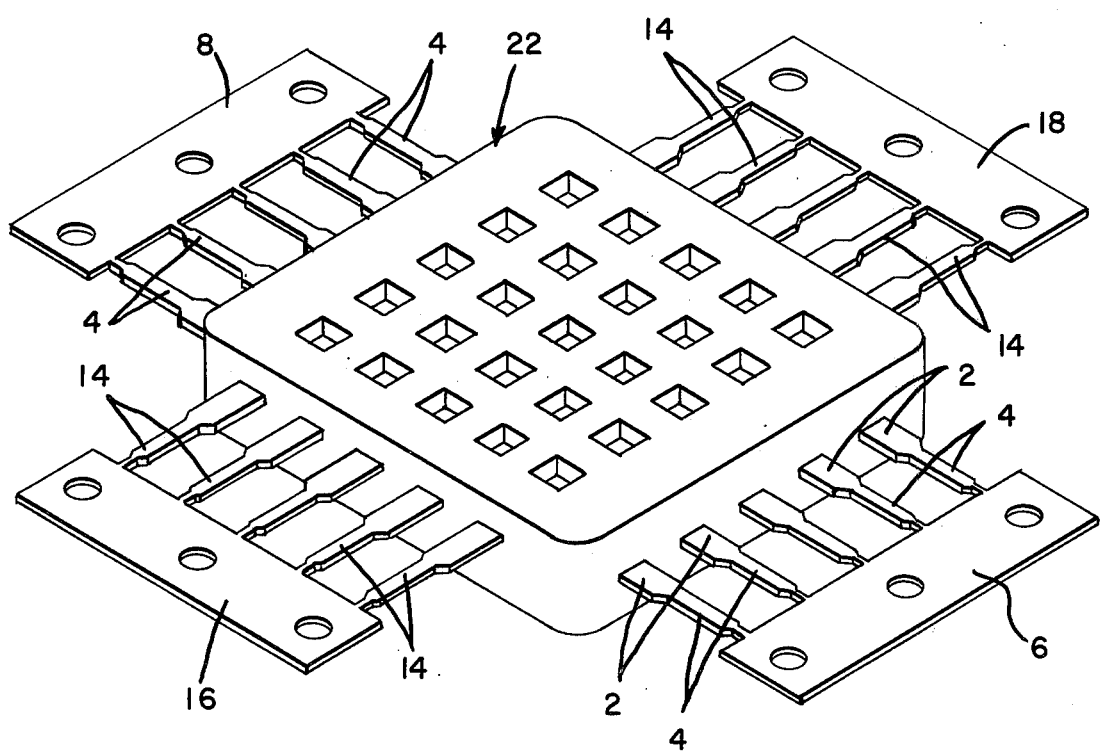
FIG. 4 is an enlarged perspective of the conductors shown in FIG. 3 subsequent to being embedded in a molded substrate of elastomeric material having a matrix of apertures or openings therein.

With more particular reference to FIG. 1 of the drawings there is illustrated generally at 1 a pin board assembly according to the present invention. Details of the assembly, illustrated in FIGS. 3 and 4, include a first row of planar elongate conductors 2, the end portions 4 of which are of reduced width to provide pluggable electrical leads which initially are integral with removably secured carrier strips 6 and 8. As shown the conductors 2 are coplanar and arranged parallel in a row. The conductors 2 further are provided with coplanar projecting barbs 10 for a purpose to be described. A second row of planar elongate conductors 12 are illustrated in FIG. 3 having the end portions thereof configured in reduced width pluggable electrical lead portions 14 which are in turn integral with corresponding removable carrier strips 16 and 18. As shown the contacts 12 are coplanar in a row and are provided with coplanar integral barbs 20 for a purpose to be described. The conductors 12 are positioned in a plane which is in spaced relationship from the plane of the conductors 2. The conductors 12 also extend at desired angles with respect to the conductors 2. Preferably the conductors 2 and 12 are perpendicular.

The conductors 2 and 12 are suitably positioned as shown in FIG. 3 prior to a molding operation. With the contacts 2 and 12 maintained in their positions shown in FIG. 3 a substrate 22 is molded in place; and the contacts are embedded in fixed positions within the substrate with the lead portions 4 and 14 projecting outwardly of the substrate. Subsequently the carrier strips 6, 8, 16 and 18 may be removed and the lead portions 4 and 14 may be bent over to depend from the substrate as shown more particularly in FIGS. 4–7.

The substrate 22 is provided with a plurality of openings 24 therethrough which extend from a top surface 26 to a bottom surface 28 of the substrate. The openings 24 alternatively may also be in the form of recesses which communicate with the top surface 26, but which terminate before reaching the bottom surface 28. The openings 24 are arranged in columns and rows in the familiar matrix pattern. As shown more particularly in FIG. 5, each opening 24 communicates with a conductor 2 and a conductor 12. More specifically an edge margin 2a of a conductor 2 and an edge margin 12a of a conductor 12 are exposed in a corresponding opening 24. The substrate 22 includes molded column portions 30 projecting into corresponding openings 24 and serving as shims or spacers engaging, supporting and separating the edge margins 12a and 2a from each other. As shown more particularly in FIGS. 6 and 7, the edge margins 12a and 2a together with corresponding column portions 30 only partially project into corresponding openings 24, leaving the remainder of the openings uninterrupted throughout their lengths. It is these uninterrupted portions of the openings 24 which receive corresponding conductive pins, selected ones of which are shown at 32. As shown each pin 32 is of elongate cylindrical configuration provided with a frustoconical blunted tip 34 and an enlarged head 36 which is molded of dielectric material, cylindrical in configuration and provided with a groove 38 in the cylindrical periphery thereof. Each pin is inserted into a selected opening 24 through the uninterrupted portion thereof. The substrate 22 is preferably molded from an elastomeric material which yields elastically to receive the pin. This is readily accomplished by making the width of the uninterrupted portion of each aperture 24 slightly less than the width of a corresponding pin 32. Thus when a pin 32 is inserted into a selected opening 24 the elastomeric material encircling the uninterrupted portion of the opening 24 will yield elastically radially to accommodate receipt of the pin. The elastic material additionally will exert a residual resilient force radially on the inserted pin laterally biasing the pin to impinge against the edge surfaces of corresponding conductor edge margins 2a and 12a. Sufficient lateral force on the pin is provided by the elastomeric material to insure good electrical contact pressure of the pin against the edge of the edge margins 2a and 12a. Sufficient residual resilient gripping pressure is provided by the expanded elastomeric radially and along the length of the pin insures retention of the pins within the uninterrupted portion of corresponding opening 24. Each inserted pin may be readily removed when desired. The groove 38 in each pin head 36 is adapted for gripping by a forceps tool (not shown) which can be used to pull out a pin or insert the same as desired. The dielectric pin head 36 impinges against the top surface 22 to limit insertion of the pin. The pin head 36 further insulates a portion of the pin which projects outwardly of the opening into which it is inserted. Each column portion 30 prevents deflection or deformation of corresponding edge margins 2a and 12a when pins are selectively inserted or removed from corresponding openings 24.

Feet 23 are molded integral with the bottom surface 28 of the substrate 22. The barbs 10 and 20 of the contacts are embedded in the substrate 22 anchoring the contacts and particularly resist bending and twisting forces applied to the electrical leads 4 and 14.

Although a preferred embodiment of the present invention is shown and described, other preferred embodiments and modifications thereof which would be obvious to one having ordinary skill in the art are intended to be covered by the spirit and scope of the appended claims.

What is claimed is:

1. In a miniaturized pin board assembly having a first row of elongate conductors overlaid by a second row of elongate conductors and means for connecting a selected conductor of said first row with a selected conductor of said second row, the improvement comprising:

said first and second rows of conductors being embedded in an elastomeric substrate and being maintained in spaced relationship by said substrate;

said substrate being provided with a matrix of openings, each of said openings communicating with an edge margin of a conductor of said first row and also an edge margin of a conductor of said second row, and said means comprises one or more conductive pins provided with enlarged heads, each pin being inserted in a selected opening, said substrate yielding elastically to expand said selective opening in response to receipt therein of one said corresponding pin, said substrate having within each said opening a pin engaging portion which partially defines said opening, said pin engaging portion elastically engaging said inserted pin continuously the length thereof and partially therearound opposite corresponding edge margins to laterally force said respective pin against said corresponding edge margins of said conductors to establish and maintain electrical contact between said pin and said conductors.

2. The structure as recited in claim 1, wherein each opening includes a portion thereof uninterrupted along its length, each pin being inserted in an uninterrupted portion of a selected opening, said elastomeric substrate defining each said uninterrupted portion and yielding elastically to expand each uninterrupted portion in response to receipt therein of a corresponding pin.

3. The structure as recited in claim 1, wherein, each of said conductors of said first row is planar and each of said conductors of said second row is planar, said substrate includes a column portion within each of said openings separating and engageably supporting said planar conductors of said first row from said planar conductors of said second row.

4. The structure as recited in claim 3, wherein, said edge margins of said planar conductors project into corresponding openings, said substrate including column portions projecting into said corresponding openings and separating edge margins of said conductors in said first row from edge margins of said conductors in said second row, each of said column portions further serving to support said corresponding edge margins in said first and second rows during the insertion of a respective pin member into the corresponding opening.

* * * * *